United States Patent [19]

Addie et al.

[11] Patent Number: 5,241,864
[45] Date of Patent: Sep. 7, 1993

[54] DOUBLE PINNED SENSOR UTILIZING A TENSILE FILM

[75] Inventors: David L. Addie, Chandler; Ronald J. Gutteridge; Ljubisa Ristic, both of Paradise Valley, all of Ariz.

[73] Assignee: Motorola, Inc., Schaumburg, Ill.

[21] Appl. No.: 899,972

[22] Filed: Jun. 17, 1992

[51] Int. Cl.⁵ .............................................. G01L 9/12
[52] U.S. Cl. ........................................ 73/718; 73/724
[58] Field of Search ...................... 73/862.59, 718, 724

[56] References Cited

U.S. PATENT DOCUMENTS 5,181,156  1/1993  Gutteridge et al. ............... 361/283

Primary Examiner—Richard E. Chilcot, Jr.
Assistant Examiner—Ronald L. Biegel
Attorney, Agent, or Firm—Joe E. Barbee

[57] ABSTRACT

A double pinned micromachined sensor (11) which utilizes a laminated film (27) having overall tensile strength formed on top of a silicon substrate (16). The laminated film (27) comprises a layer of silicon nitride (18) encapsulated by two layers of polysilicon (19, 21), the silicon nitride (18) providing overall tension for the laminated film. The laminated film (27) is supported above the silicon substrate by support posts (17) and is selectively etched to form a sensor (11, 13).

9 Claims, 3 Drawing Sheets

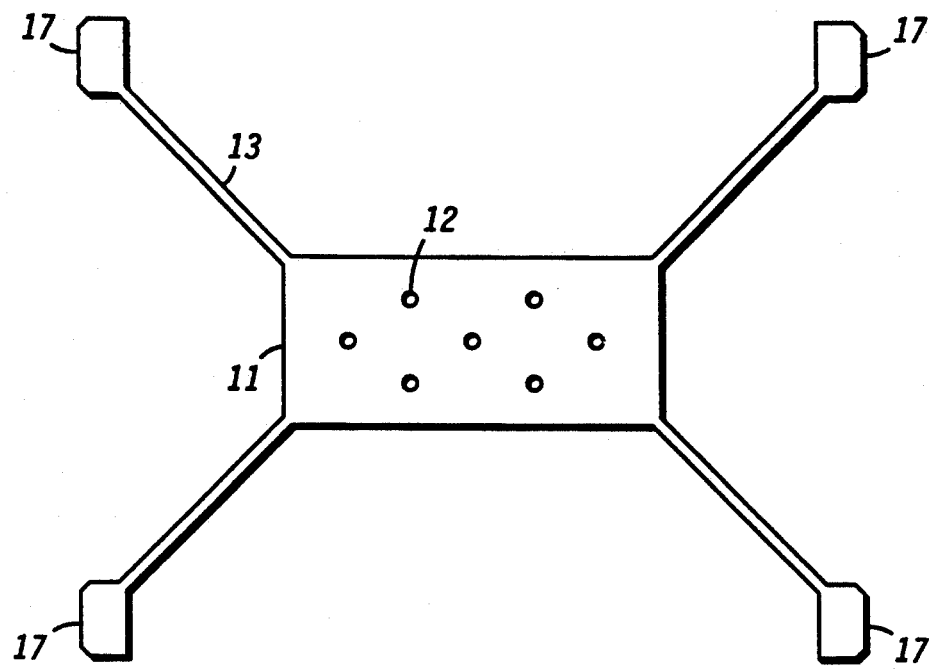
FIG. 7
FIG. 8
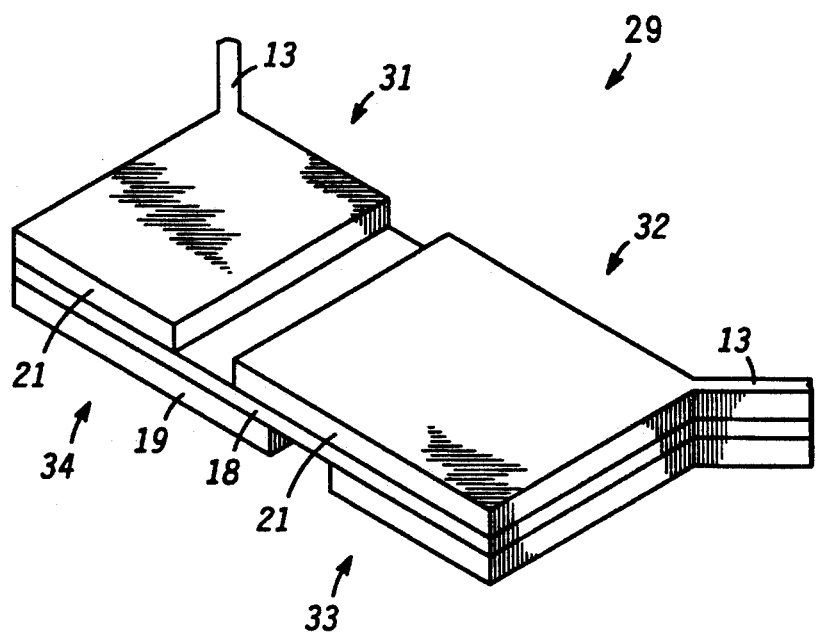

DOUBLE PINNED SENSOR UTILIZING A TENSILE FILM

BACKGROUND OF THE INVENTION

The present invention relates, in general, to a micromachined sensor, and more particularly to a double pinned micromachined sensor utilizing a composite film having a net tensile stress.

A wide variety of micromachined sensors utilize a plate suspended over a silicon substrate. This type of micromachined sensor includes accelerometers, pressure sensors, and the like. The spacing between the plate and the silicon substrate is made to change by the force being measured. This variation in spacing typically produces a proportional variation in capacitance value which is used to detect movement of the plate relative to the silicon substrate. Surface micromachined capacitors of this kind require a plate which remains parallel to the surface so that the quiescent capacitance value may be controlled. A similar form of sensor uses a closed loop control system in which a differential capacitor is used to sense changes in the position of the plate and to apply a compensating electrostatic force to minimize movement of the plate. A sensor which uses a closed loop control system is more tolerant of the spring constant, but requires precise centering of the movable plate between upper and lower fixed plates. In addition, the active positioning system typically must rely on the springs and geometric design of the sensor to control parallelism. A plate which remains parallel to the surface as a result of the spring geometry is thus even more desirable with the closed loop control system.

In the past, sensors have typically been structures supported only by one end, that is a "singly pinned" beam. Parallelism of these singly pinned structures has been controlled by balancing the vertical gradient of the polysilicon film. Compressive stresses in the top and bottom of the polysilicon film are balanced by adjustment of deposition, annealing and doping conditions. These adjustments are difficult to control well enough to equalize stresses so as to give both an adequate balance and acceptable strength This problem limits the maximum dimension of the dynamic element and complicates manufacturing. A double pinned structure supported by multiple supports which are under tension is inherently more parallel to the surface. A double pinned structure of this kind requires a tensile film, but heavily doped polysilicon films are characteristically compressive. As a result a polysilicon film which is heavily doped to provide electrical conductivity cannot be used to fabricate such a double pinned structure.

A double pinned structure utilizing beams made from a polysilicon film is described in U.S. Pat. No. 5,090,254 entitled "Polysilicon resonating beam transducers", issued on Feb. 25, 1992, to H. Guckel et al, assigned to Wisconsin Alumni Research Foundation, and which is incorporated herein by reference. This patent describes a polysilicon film which is typically deposited at a rate of 68 angstroms per minute and then annealed to produce a zero or low tensile stress beam. The rate of deposition is significantly slower than the 120 angstroms per minute typically used in semiconductor manufacturing. When building a film that is typically 20,000 angstroms thick the slow rate of deposition adds several hours to this deposition step alone. The annealing required is incompatible with the requirements of some semiconductor manufacturing. Furthermore, this method uses substantially undoped polysilicon which requires that a separate doping step be performed. This method cannot produce a structure having a well controlled film stress or a high tensile stress. For example, the method disclosed does not allow enough control over film stress to form selected regions of tension and rigidity in the film.

There is a need for a film suited for fabrication of sensors which exhibits a tensile stress. The film should be compatible with standard semiconductor manufacturing methods, use heavily doped polysilicon, and be formed into desired patterns by commonly used photolithographic methods.

SUMMARY OF THE INVENTION

Briefly stated, the present invention provides a double pinned micromachined sensor which utilizes a laminated film having overall tensile strength. The laminated film comprises a layer of silicon nitride encapsulated by two layers of polysilicon. The laminated film is supported above the silicon substrate by support posts and is selectively etched to form a sensor.

BRIEF DESCRIPTION OF THE DRAWINGS

FIG. 7 shows a top view of a double pinned sensor fabricated using the structure of FIG. 6; and FIG. 8 shows a cross section view of a double pinned sensor having two conductive sensor plates.

DETAILED DESCRIPTION OF THE DRAWINGS

Figure 1:
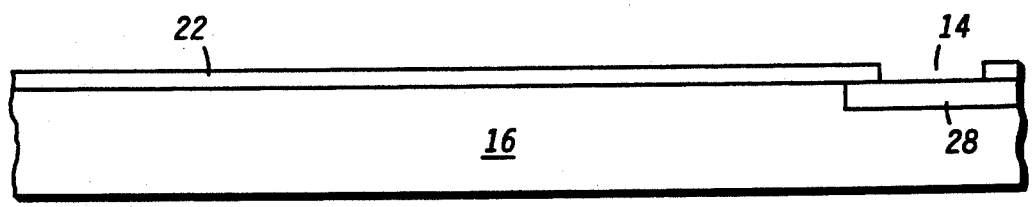
FIG. 1 shows a cross section of a starting wafer.

FIG. 1 shows a cross section of a silicon starting wafer having a first silicon nitride layer 22 deposited on an upper surface of a silicon substrate 16 as a preferred embodiment in accordance with the present invention. First silicon nitride layer 22 is deposited to a thickness of approximately 3,000 Angstroms. First silicon nitride layer 22 is then etched to create a contact opening 14.

Figure 2:
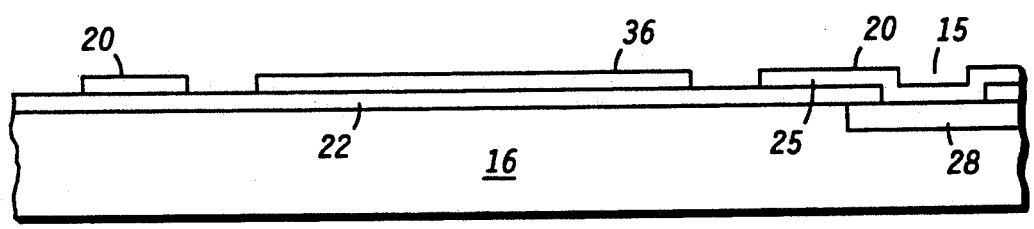
FIG. 2 shows a cross section of the starting wafer of FIG. 1 having a patterned polysilicon layer.

FIG. 2 shows a cross section of the starting wafer of FIG. 1 having a first polysilicon layer 10. First polysilicon layer 10 is deposited to a thickness of approximately 3,000 Angstroms. First polysilicon layer 10 is selectively etched to form a capacitive plate 36, a conductive path 25, and a plurality of support areas 20. First polysilicon layer 10 is also deposited into contact opening 14 to form an electrical contact 15 between conductive path 25 and a plurality of integrated circuit components 28 previously fabricated on silicon substrate 16.

Figure 3:
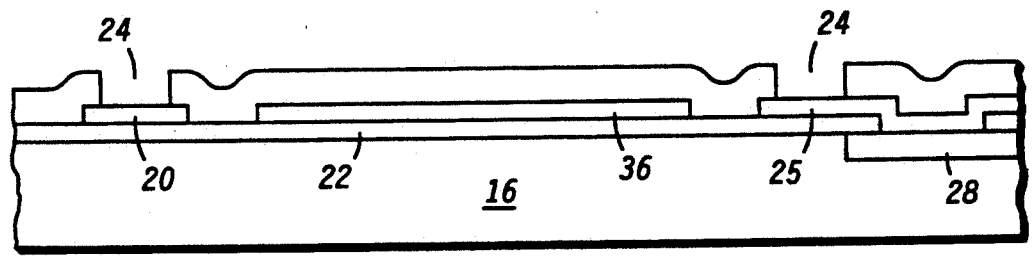
FIG. 3 shows a cross section of the starting wafer of FIG. 2 having a patterned PSG layer.

FIG. 3 shows a cross section of the starting wafer of FIG. 2 after deposition of a PSG layer 23 on top of silicon nitride layer 22. PSG layer 23 is phosphosilicate glass which is deposited to a thickness of approximately 20,000 Angstroms. PSG layer 23 is selectively etched to provide a plurality of support openings 24.

Figure 4:
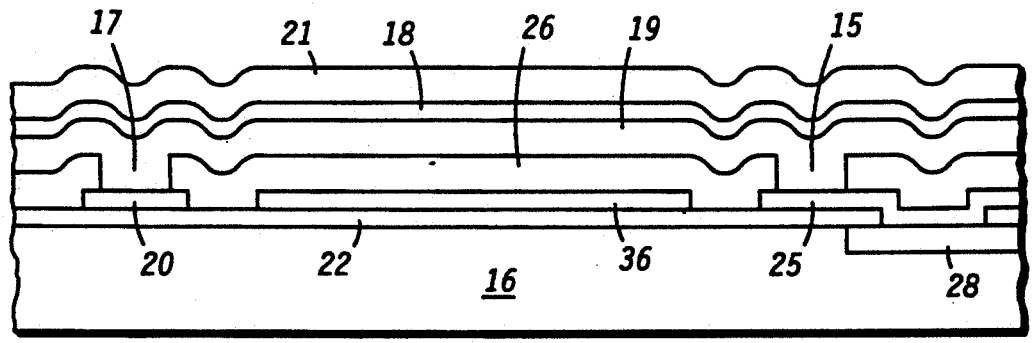
FIG. 4 shows a cross section of the wafer of FIG. 3 after formation of a laminated film.

FIG. 4 shows a cross section of the wafer of FIG. 3 after a second polysilicon layer 19, a second silicon nitride layer 18, and a third polysilicon layer 21 form a laminated film 27. Approximately 5,000 Angstroms of polysilicon is deposited over PSG layer 23 to form second polysilicon layer 19. A second silicon nitride layer 18 is deposited to a thickness of approximately 3,000 Angstroms over second polysilicon layer 19. Third polysilicon layer 21, also having a thickness of approximately 5,000 Angstroms is deposited over second silicon nitride layer 18 so as to enclose second silicon nitride layer 18. Second polysilicon layer 19 and third polysilicon layer 21 are heavily doped so as to provide electrical conductivity. A plurality of support posts 17 are formed when second polysilicon layer 19 is deposited into support openings 24. Electrical contact 15 and conductive path 25 are used to electrically couple second polysilicon layer 19 to integrated circuit components 28 as well as to capacitive plate 36.

Alternative embodiments in accordance with the present invention use photolithography and etching to remove second silicon nitride layer 18 from predetermined areas before the deposition of third polysilicon layer 21. In this way a laminated film is fabricated having predetermined areas comprising only second polysilicon layer 19 and third polysilicon layer 21. Since second silicon nitride layer 18 provides the tensile force within laminated film 27, this results in a laminated film having predetermined areas of tension and other predetermined areas of low compression or rigidity.

Figure 5:
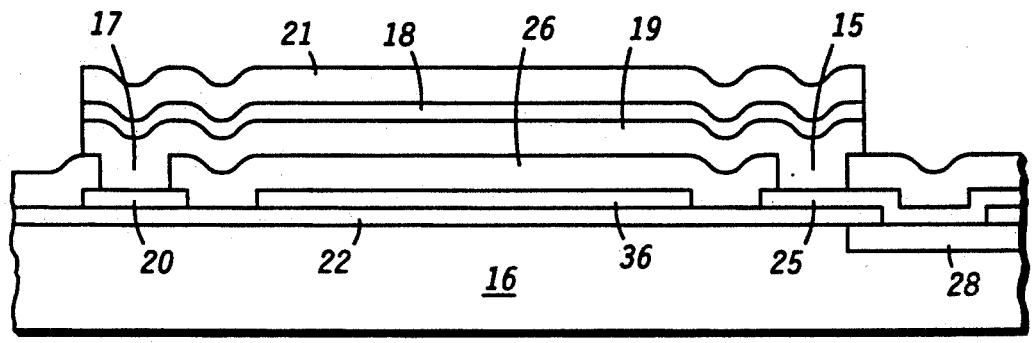
FIG. 5 shows a cross section of the wafer of FIG. 4 after patterning of the laminated film.

FIG. 5 shows a cross section of the wafer of FIG. 4 after photolithographic patterning and etching of laminated film 27 to a desired shape.

Figure 6:
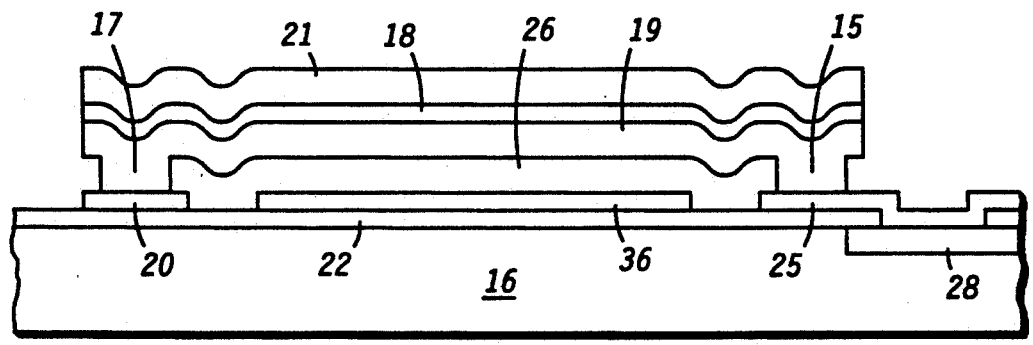
FIG. 6 shows a cross section of the wafer of FIG. 5 after removal of the PSG layer.

FIG. 6 shows a cross section of the wafer of FIG. 5 after removal of PSG layer 23. Removal of PSG layer 23 leaves a gap 26 between second polysilicon layer 19 and first silicon nitride layer 22. Laminated film 27 is formed into a structure which spans gap 26 above first silicon nitride layer 22. The tensile stress of second silicon nitride layer 18 overcomes the compression of second polysilicon layer 19 and third polysilicon layer 21 so laminated film 27 is in an overall state of tension.

FIG. 7 shows a top view of a double pinned sensor utilizing laminated film 27 as a preferred embodiment in accordance with the present invention. A sensor plate 11 and a plurality of beams 13 are formed by selective etching of laminated film 27. Sensor plate 11 is suspended over first silicon nitride layer 22 by the plurality of beams 13, and is held in place by the tensile force from beams 13. A plurality of holes 12 are formed in plate 11 to enhance the flow of etchant during fabrication. Support posts 17 are attached to the upper surface of first silicon nitride layer 22, serving to hold beams 13 in place. The preferred embodiment uses four beams 13 as shown. This geometry combined with the tension from beams 13 provides a support for sensor plate 11 which is inherently parallel to first silicon nitride layer 22. Sensor plate 11 is electrically coupled to one beam 13 which is electrically connected to support posts 17. Support posts 17 in turn make electrical contact to conductive path 25 (FIG. 6) and hence to integrated circuit components 28 (FIG. 6) though electrical contact 15 (FIG. 6). Vertical motion of sensor plate 11 is detected by sensing capacitance changes between capacitive plate 36 (FIG. 6) and sensor plate 11, providing a measure of the force being measured.

An alternative preferred embodiment of the present invention adds a fourth layer of polysilicon to form a second capacitor plate above sensor plate 11 allowing use of differential sensing. For clarity the second capacitor plate is not shown. Another alternative embodiment omits first polysilicon layer 10, depositing PSG layer 23 directly over first silicon nitride layer 22. In this embodiment, electrical contact to integrated circuit components 28 is made directly from second polysilicon layer 19. Capacitive plate 36 is then formed by diffusing a conductive area on the surface of silicon substrate 16 beneath plate 11.

FIG. 8 shows a cross section view of a double pinned sensor plate 29 having a first conductive sensor plate 31, a second conductive sensor plate 32, a third conductive sensor plate 33, and a fourth conductive sensor plate 34 as an alternative embodiment in accordance with the present invention. Double pinned sensor plate 29 utilizes the embodiment which has four beams 13, of which only two are shown in the cross section. During deposition of the laminated film (FIG. 4), second polysilicon layer 19 and third polysilicon layer 21 were removed from the laminated film to leave an area comprising only second silicon nitride layer 18. The area comprising only second silicon nitride layer 18 serves to divide second polysilicon layer 19 and third polysilicon layer 21 into a plurality of electrically conductive areas, each electrically insulated from one another. Second silicon nitride layer 18 extends to the edges of second polysilicon layer 19 and third polysilicon layer 21 so as to electrically insulate second polysilicon layer 19 from third polysilicon layer 21. In this way second polysilicon layer 19 has been patterned to form first conductive sensor plate 31 and second conductive sensor plate 32, each electrically coupled to external circuitry through that part of second polysilicon layer 19 which comprises one of the beams 13. Likewise, third polysilicon layer 21 has been patterned to form third conductive sensor plate 33 and fourth conductive sensor plate 34, each electrically coupled to external circuitry through that part of third polysilicon layer 21 which comprises one of the beams 13.

The present invention provides a film suited for fabrication of sensors which exhibits a net tensile stress. The film is compatible with commonly used semiconductor manufacturing methods, and can be formed into desired patterns by commonly used photolithographic methods. The film can be used to produce a structure having selected regions of tension and rigidity. Sensor plates can be formed which have a plurality of independent electrically conductive areas.

We claim:

1. A double pinned sensor utilizing a tensile film, comprising:
    a silicon substrate;
    a first silicon nitride layer over the silicon substrate;
    a first polysilicon layer over the first silicon nitride layer which is patterned to form a capacitor plate, a conductive path, and a plurality of support areas;
    a second polysilicon layer, the second polysilicon layer being heavily doped, over the first polysilicon layer and being supported above the first polysilicon layer by a plurality of support posts bonded to the support areas;
    a second silicon nitride layer over the second polysilicon layer;
    a third polysilicon layer, the third polysilicon layer being heavily doped, and which totally encloses the second silicon nitride layer between the second polysilicon layer and the third polysilicon layer such that the second polysilicon layer, second silicon nitride layer, and the third polysilicon layer form a conductive laminated film having overall tensile stress which extends across the entire wafer;

a plurality of conductive beams having overall tensile stress and a sensor plate formed by selective etching of the conductive laminated film, the conductive beams serving to support the sensor plate in a predetermined position above the first silicon nitride layer; and a conductive path which includes the support posts and the conductive beams, the conductive path serving to electrically couple the sensor plate to a plurality of integrated circuit components fabricated on the silicon substrate.

2. A double pinned sensor utilizing a tensile film, comprising:

a silicon substrate;

a first silicon nitride layer over the silicon substrate;

a first polysilicon layer over the first silicon nitride layer which is patterned to form a capacitor plate, a conductive path, and a plurality of support areas;

a second polysilicon layer over the first polysilicon layer and separated from the first polysilicon layer by a plurality of support posts in such a way that a structure is formed which spans a gap of predetermined height;

a second silicon nitride layer over the second polysilicon layer; and a third layer of polysilicon which encloses the second silicon nitride layer between the second polysilicon layer and the third polysilicon layer such that the second polysilicon layer, second silicon nitride layer, and the third polysilicon layer form a laminated film with overall tensile stress.

3. The double pinned sensor utilizing a tensile film of claim 2 further comprising:

a plurality of beams having a tensile stress which support a sensor plate, the beams and the sensor plate being formed by selective etching of the laminated film.

4. The double pinned sensor utilizing a tensile film of claim 3 further comprising:

a plurality of conductive areas formed from predetermined areas of the second polysilicon layer and the third polysilicon layer, separated by an electrically insulating region fabricated as part of the sensor plate.

5. The double pinned sensor utilizing a tensile film of claim 3 wherein the sensor plate is a rigid structure formed by selective etching of the second silicon nitride layer to remove the second silicon nitride layer from that part of the laminated film which comprises the sensor plate.

6. The double pinned sensor utilizing a tensile film of claim 2 further comprising:

an electrical coupling between the second polysilicon layer and a plurality of integrated circuit components fabricated on the silicon substrate which is provided by one of the support posts making electrical contact to the plurality of integrated circuit components.

7. A method for fabricating a double pinned sensor utilizing a tensile film, comprising:

providing a silicon substrate;

depositing a first layer of silicon nitride over the silicon substrate;

depositing a layer of phosphosilicate glass over the first layer of silicon nitride;

forming a plurality of support openings through the layer of phosphosilicate glass;

forming a contact opening by further extending a predetermined support opening through the first layer of silicon nitride to the silicon substrate;

depositing a second layer of polysilicon over the layer of phosphosilicate glass;

attaching the second layer of polysilicon to the first layer of silicon nitride by a plurality of support posts formed by filling the plurality of support openings with the second layer of polysilicon;

creating an electrical contact between the silicon substrate and the second layer of polysilicon by filling the contact opening with the second layer of polysilicon;

depositing a second layer of silicon nitride over the second layer of polysilicon;

depositing a third layer of polysilicon so as to enclose the second layer of silicon nitride between the second layer of polysilicon and the third layer of polysilicon to form a laminated film having overall tensile stress;

photolithographically patterning the laminated film;

selectively etching the laminated film to form a sensor plate supported by a plurality of beams; and removing the layer of phosphosilicate glass so the laminated film spans a gap of predetermined height.

8. The method for fabricating the double pinned sensor utilizing a tensile film of claim 7, further comprising:

selectively etching the second layer of silicon nitride to produce a laminated film having predetermined areas of tensile stress and predetermined areas of rigidity.

9. The method for fabricating the double pinned sensor utilizing a tensile film of claim 7, further comprising:

depositing a first layer of polysilicon over the first layer of silicon nitride prior to deposition of the layer of phosphosilicate glass.

* * * * *